United States Patent [19]

Neukermans et al.

[11] Patent Number: 5,026,437

[45] Date of Patent: Jun. 25, 1991

[54] CANTILEVERED MICROTIP MANUFACTURING BY ION IMPLANTATION AND ETCHING

[75] Inventors: Armand P. Neukermans, Palo Alto; Josef Berger, Los Altos, both of Calif.

[73] Assignee: Tencor Instruments, Mountain View, Calif.

[21] Appl. No.: 467,976

[22] Filed: Jan. 22, 1990

[51] Int. Cl.[5] .................. H01L 21/266; H01L 21/306
[52] U.S. Cl. .................................. 148/33.3; 156/653; 156/657; 437/20; 437/981
[58] Field of Search ............... 156/643, 649, 653, 657; 437/20, 28, 30, 35, 36, 249, 915, 981, 21, 22; 357/26, 91

[56] References Cited

U.S. PATENT DOCUMENTS

| | | | |
|---|---|---|---|
| 3,769,109 | 10/1973 | MacRae et al. | 156/3 |
| 3,945,856 | 3/1976 | Koenig et al. | 437/931 |
| 4,159,915 | 7/1979 | Anantha et al. | 156/653 |
| 4,307,507 | 12/1981 | Gray et al. | 437/981 |
| 4,698,129 | 10/1987 | Puretz et al. | 156/643 |
| 4,716,127 | 12/1987 | Shukuri et al. | 437/22 |
| 4,744,861 | 5/1988 | Matsunaga et al. | 156/657 |
| 4,801,350 | 1/1989 | Mattox et al. | 156/643 |
| 4,808,285 | 2/1989 | Chen et al. | 204/157.15 |
| 4,916,002 | 4/1990 | Carver | 156/653 |
| 4,968,382 | 11/1990 | Jacobson et al. | 156/643 |
| 4,968,585 | 11/1990 | Albrecht et al. | 156/643 |
| 4,968,628 | 11/1990 | Delgado et al. | 437/21 |

OTHER PUBLICATIONS

P. M. Sarro, A. W. van Herwaarden; Journal Electrochem. Soc.: Solid State Sci & Tech., pp. 1724–1729.
T. R. Albrecht et al., Micro Fabrication of Cantilever Styli for the A.F.M., J. Vac. Sci. & Tech. A, pp. 3386–3396, Jul./Aug. 1990.
Smith, I. and Howland, R.: App. of S.F.M. in the Semicond. Ind. Solid State Technology, Dec. 1990, pp. 53–56.
J. B. Angell et al., "Silicon Micromechanical Devices", Scientific American (Apr. 1983), pp. 44–55.
Binnig et al., "The Scanning Tunneling Microscope", Scientific American (Aug. 1985), pp. 50–56.
H. K. Wickramasinghe, "Scanned-Probe Microscopes", Scientific American (Oct. 1989), pp. 98–105.
H. A. Waggener, "Electrochemically Controlled Thinning of Silicon", Bell System Tech. Jour., 49 (Mar. 1970), pp. 473–475.
B. Kloeck et al., "Study of Electrochemical Etch-Stop for High Precision Thickness Control of Silicon Membranes", I.E.E.E. Trans. on Electron Devices 36 (Apr. 1989), pp. 663–669.

*Primary Examiner*—Olik Chaudhuri
*Assistant Examiner*—Steven A. Katz
*Attorney, Agent, or Firm*—Schneck & McHugh

[57] ABSTRACT

A method for fabricating a microtip, cantilevered from a base and having a controllably high aspect ratio, for use in microprobe microscopy to probe variations in materials at the atomic level. A two-layer semiconductor material structure is provided, one layer being n type and the other layer being p type. A thin pencil of ions of n type is implanted through the n type layer into the p type layer, through a small aperture in a mask layer that overlies the n type layer. The p type material is then etched away, leaving the n type ion profile and the n type layer as a cantilevered microtip. The n type semiconductor layer may be replaced by a layer of any material that resists etching by the selected etchant.

39 Claims, 2 Drawing Sheets

CANTILEVERED MICROTIP MANUFACTURING BY ION IMPLANTATION AND ETCHING

DESCRIPTION

1. Field of the Invention

This invention relates to fabrication of microstructures, and more particularly to fabrication of a cantilevered microtip useful in scanned probe microscopy.

2. Background of the Invention

Scanned probe or atomic force microscopy requires the fabrication and use of very small cantilevered tips of material with atomic dimensions. The projection from a cantilever base is provided with a very sharp tip, and this projection behaves as a spring with a very high resonance frequency. The sharp tip is used to trace the atomic profile, through use of Van der Waals forces, through electrical or magnetic forces, or through short range atomic exclusion forces. Several varieties of scanned probe microscopes have been discussed by Wickramasinghe in "Scanned Probe Microscopes," *Scientific American*, Oct. 1989, 98–105 and by Binnig and Rohrer in "The Scanning Tunneling Microscope," *Scientific American*, Aug. 1985, pp. 50–56.

Microfabrication of small mechanical devices such as nozzles, membranes, cantilever beams, heat sinks, accelerometers and Pressure sensors is discussed by Angell et al. in "Silicon Micromechanical Devices," *Scientific American* (April 1983), pp. 44–55. The authors disclose that a cantilever beam of silicon dioxide can be formed by (1) forming a heavily boron-doped etch step layer in silicon; (2) forming an epitaxial silicon layer on top of the doped layer; (3) growing an oxide layer on the epitaxial silicon layer; (4) providing an aperture in the oxide layer; (5) introducing anisotropic etchant into the aperture and allowing etching to proceed. If an oxide tab protrudes into the aperture region, the etchant will undercut the tab, forming a cantilevered beam. The cantilever base and beam thus fabricated are necessarily both of silicon oxide material, and shaping of the beam appears to be difficult. No dimensions are indicated for a cantilevered beam fabricated in this manner.

Production of a tapered $SiO_2$ film is disclosed by MacRae et al. in U.S. Pat. No. 3,769,109, using an ion beam directed at the region of film material where a taper is desired. The longitudinal and transverse etch rates in the (shallow) region exposed to the ion beam are much higher than the etch rate of the unexposed region. Etching through the exposed region and into the unexposed region produces a taper because of the difference in etch rates. This technique appears to be useful primarily in producing tapered holes and other apertures.

Charged particle beams have been used for fabrication of micron-scale structures. In U.S. Pat. No. 4,698,129, Puretz et al. disclose use of an ion beam, directed at a selected face of a body of material, to remove material therefrom and to shape a desired optical surface from that material. The target or body may be of semiconductor material such as GaAs or other material used for semiconductor lasers. As disclosed, this approach appears to be useful primarily in creating apertures in a body of material.

A method for fabrication of trenches and similar structures with submicron features is disclosed by Mattox et al. in U.S. Pat. No. 4,801,350. A shaping layer of organic material is placed on the surface to be shaped, and the shaping layer is partly etched through vertically, using optical lithography techniques, to provide a trench having a larger width than desired. An oxide layer of appropriate thickness is then deposited on the vertical sidewalls to produce the desired trench width. An anisotropic etchant is then introduced into the trench and allowed to etch vertically to complete the structure. This produces a trench or other aperture with different portions of the sidewalls being lined with oxide or with a semiconductor material such as silicon.

Chen et al., in U.S. Pat. No. 4,808,285, disclose a method for making optical waveguides, Y couplers and related optical structures on a microscopic scale by first exposing an organic material, polydiacetylene, to an electron beam to cause a change in refractive index of the target material. The irradiated material then behaves as an optical fiber would behave, channeling the light along the irradiated corridors of material that have a different refractive index than the surrounding bulk material. As a result of this process, optical properties of these corridors are modified, but the corridors remain embedded in the surrounding bulk material.

The microtip used in scanned probe microscopy will be spaced apart from the material being scanned by the microtip by a distance as small as 2–200 Å so that the dimensions of the tip itself must be known with an accuracy better than this distance of separation. Preferably, the transverse dimensions of the microtip should be a small fraction of a micron, the microtip itself should be provided with a more massive base from which it projects, and the tip should be fabricable from either electrically conducting or electrically insulating material.

SUMMARY OF THE INVENTION

These needs are met by the invention, which provides a cantilevered microtip constructed from a semiconductor material. The semiconductor material may be undoped or neutralized and thus behave as an insulator; or the semiconductor material may be doped to provide a microtip material that is electrically conducting with arbitrarily prescribed conductivity. The cantilevered microtip is fabricated by providing a thin layer of semiconductor material of one electrical conductivity type (e.g., n type) contiguous to a thicker layer of semiconductor material of a second, opposite electrical conductivity type (e.g., p type). A thin beam of high energy ions, drawn from an element of first conductivity type, is directed through the first layer into the second layer so that a long, thin ion profile of high aspect ratio (ratio of longitudinal diameter divided by transverse diameter) of the second material is converted to semiconductor material of the first conductivity type. The second layer of material, with the exception of the ion profile therein of first conductivity type, is etched away, leaving the first layer as a cantilever base with the material in the ion profile projecting from this base to form a microtip. The microtip may be further bombarded with ions or further etched to further shape the microtip to the desired configuration. The first layer of semiconductor material may be replaced by a material that resists the selected etchant.

In a second embodiment, the relatively thin layer of first conductivity type is positioned as a buried layer in the second conductivity type material and the ion implantation beam energy is adjusted so that the ion profile of first conductivity type extends from an exposed surface of the second conductivity type material to the buried layer of first conductivity type. The second conductivity type material, with the exception of the ion profile material of first conductivity type, is etched away, leaving a microtip that again projects from a cantilever base. The thin layer of first conductivity type may be replaced by a layer that resists etching by the selected etchant.

BEST MODE FOR CARRYING OUT THE INVENTION

Figure 1:
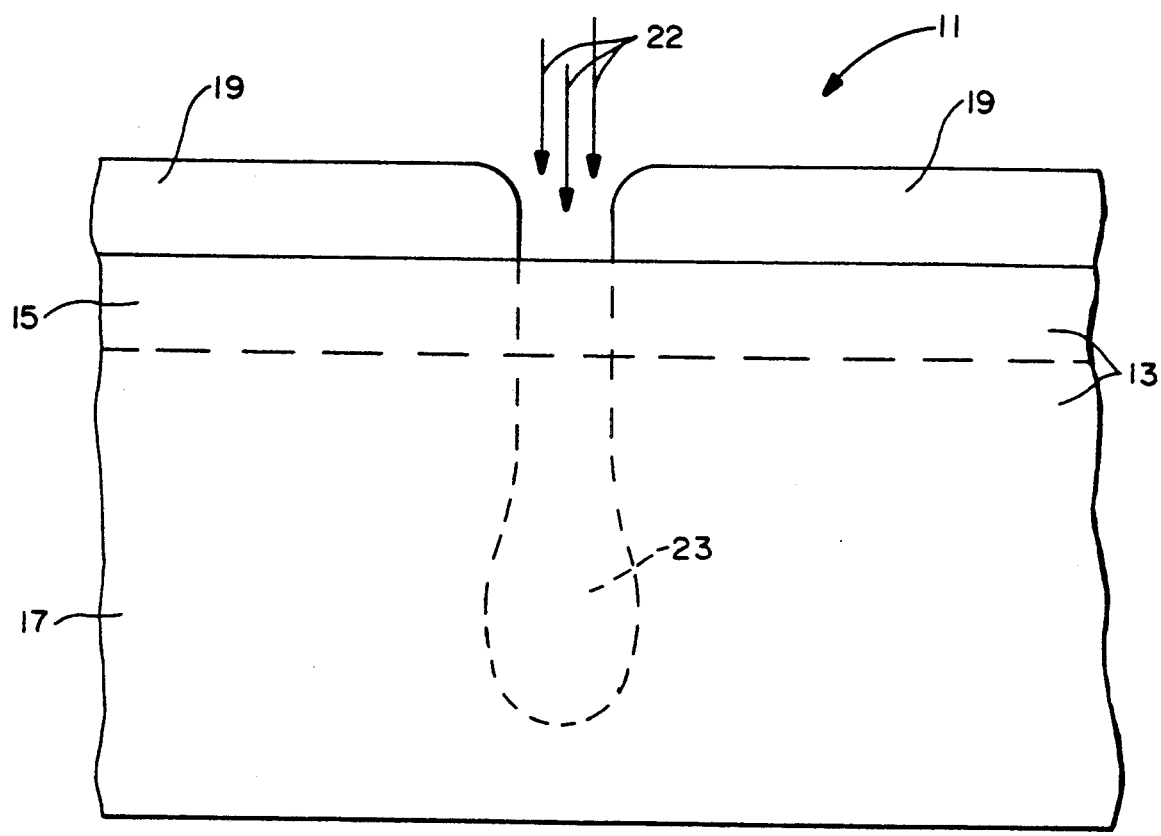
FIG. 1 is a sectional side view illustrating one method of fabricating a cantilevered microtip according to the invention.

With reference to FIG. 1, a system 11 includes a sheet 13 of semiconductor material that includes a top layer 15 of first electrical conductivity type (e.g., n type) and a second, underlying layer 17 of second electrical conductivity type (e.g., p type) that is opposite to the first electrical conductivity type. The system 11 also includes an overlying layer 19 of masked material having an aperture 21 of controllably small diameter therein, generally less than 0.25 $\mu$m, to expose a small portion of the first layer 15 of first conductivity type. Preferably, the first layer 15 of first conductivity type should have a thickness in the range 0.01–0.3 $\mu$m. The mask material may be a metal, an insulator or a semiconductor material. A beam 22 of approximately monoenergetic ions, drawn from an element of first conductivity type, is directed through the aperture 21 so that the ions penetrate the first layer of first conductivity type 15 and most, but not all, of the second layer of second conductivity type to form an ion profile 23 of first conductivity type material in the second layer 17.

Ion kinetic energies of 50–500 keV should be satisfactory for this purpose, unless the microtip is to have a very high aspect ratio, in which case higher energy ions may be required. The process of ion implantation is discussed by S. K. Ghandhi, *VLSI Fabrication Principles*, John Wiley and Sons, 1983, pp. 299–370, and by S. M. Z. (editor), *VLSI Technology*, McGraw-Hill Book Company, 1983, pp. 219–265. These references are incorporated herein by reference. The ions used for ion implantation may be drawn from a group of p type elements, which produces an excess of holes in the semiconductor material, such as beryllium, boron, magnesium, aluminum, gallium, and indium. Alternatively, the implantation ions may be drawn from a group of n type elements, which produces a surplus of electrons in the semiconductor material, such as nitrogen, oxygen, phosphorus, sulfur, arsenic, selenium and antimony.

The boundary of an ion profile, using doping drawn from an element of first conductivity type, in a host material of second (opposite) conductivity type is defined by a surface (junction) in the host material at which the average density of ions of first conductivity type equals the concentration of dopant particles of second conductivity type. Within the portion of the host material surrounded by this surface, the average density of ions of first conductivity type exceeds the second conductivity type dopant concentration so that this interior region is converted to first conductivity type. If the spatial distribution of implanted ions is fixed within the host material, choice of a relatively high concentration of second conductivity type dopant (at least equal to $10^{17}$ cm$^{-3}$) will provide a relatively short or stubby ion profile with an aspect ratio as low as 1–5. Choice of a relatively low concentration of second conductivity type dopant (typically $10^{14}-10^{16}$ cm$^{-3}$) will produce a longer, relatively slender ion profile with an aspect ratio of 5–10 or even higher. The relative numbers here will vary with the ion implant dose, which is typically $10^{12}-10^{15}$ ions/cm$^2$, and with the ion kinetic energy chosen. This allows the aspect ratio of the ion profile to be controlled by choice of (1) concentration of second conductivity type dopant, (2) ion kinetic energy, (3) ion implant dose and (4) diameter of aperture in the ion implant mask.

As discussed in the book by Ghandhi, op. cit., an ion having an energy of, say, 50 keV or higher will have a statistically determined longitudinal range, a longitudinal straggle parameter (approximately 20% of the longitudinal range) and a transverse straggle parameter, where the range and two straggle parameters depend upon the initial kinetic energy of the ions. For example, at 100 keV, an ion of boron or phosphorus will have a projected longitudinal range of 0.3 $\mu$m and 0.13 $\mu$m, respectively, assuming that the ions are initially traveling in a direction that does not correspond to one of the ion channeling directions in the semiconductor material.

If a greater range is desired in order to produce an ion profile 23 with a higher aspect ratio, the incident ion beam 22 should be directed along one of the ion channeling directions, which may produce longitudinal ranges of the order of 1–10 $\mu$m for initial kinetic energies of 100–300 keV. For example, Wilson et al. report in Electrochem. Soc., Silicon 1977, pp. 1023–1034, that 300 keV As ion implants in the <110> channeling direction in Si produced a longitudinal range of the order of 4 $\mu$m and extending to 6 $\mu$m for 800 keV initial ion energies. Ion channeling occurs because along certain crystallographic directions in a crystalline material, the ions travel 2–50 times farther than along a non-channeling direction where the transport of ions occurs through scattering and other statistically controlling processes. If the implanted ions are directed along a channeling direction in the semiconductor material, the thickness of the first layer of first conductivity type 15 can be as high as 1–2 microns because the longitudinal range of the implanted ions will be several times larger than this dimension and will extend much further into the second layer 17 of second conductivity type. This will produce a cantilever base, namely the first layer 15, having a bigger dimension in the direction of ion implantation and is an advantage of use of a channeling direction for ion implantation. However, non-channeling directions for ion implantation may also be used here, with qualitatively similar results.

The masked layer 19 may be a negative photoresist material such as one of the Eastman Kodak, Waycoat or Isopoly materials, or may be a positive photoresist material such as one of the Hoechst Celanese AZ materials or one of the materials available from Eastman Kodak or from Waycoat. Many such materials are discussed by D. J. Elliott, *Integrated Circuit Fabrication Technology*, McGraw-Hill Book Company, 1982, pp. 63–86. Other materials, such as oxides or nitrides of the semiconductor material in the first layer, may also be used here to produce a mask for ion implantation that supports an aperture with a controllably small diameter, preferably of the order of 0.01–1 μm. Preferably, the masked layer 19 should be at least 99.9% effective in masking the implantation ions from the non-exposed surface of the semiconductor material. For ion implantation energies of the order of 50–500 keV, mask thicknesses of the order of 0.02–1 μm are appropriate here, as discussed by Ghandhi, op. cit.

It is preferable to use relatively small p type doping concentration ($10^{14} - 10^{16}$ cm$^{-3}$) in the second layer 17 in FIG. 1 in order to produce an ion profile 23 with a relatively high aspect ratio (higher than 5). If the aspect ratio of the desired microtip is modest, say 2–4, the p type doping concentration in the second layer 17 in FIG. 1 may be much higher, as discussed above.

After the ion profile 23 is formed in the semiconductor material 13, the remaining portions of the second layer 17 of second conductivity type are selectively etched away with an electrolytic etchant so that a structure 31 (FIG. 2) resembling a cantilever base 33 with a cantilevered beam or projection 35 remains after the etching process is completed. Many selective etchants are available that will etch p type semiconductor material at a reasonable etch rate but will have no substantial etching effect on n type semiconductor material. An example of such an etchant is an acid consisting of 8 parts $HNO_3$ plus 1 part HF plus 1 part $HC_2H_3O_2$ (designated 8 $HNO_3$:1 HF:1 $Hc_2H_3O_2$ herein).

This technique may also be implemented by implanting ions produced from p type elements in an n type semiconductor layer, then using an etchant that selectively removes the n type material and leaves the p type ion profile.

If an etchant with sufficient selectivity (for type versus p type doping) is not available, an anisotropic etchant may be used, with the longitudinal direction of the cantilevered microtip being chosen as a direction of slow etch rate relative to the etch rate in a direction that is perpendicular to this longitudinal direction. For example, etching of silicon proceeds at a relatively fast rate on {100} crystal planes, proceeds at an intermediate rate on {110} crystal planes, and proceeds at relatively slow rates on {111} crystal planes because of the close spacing of the {111} planes.

Figure 2:
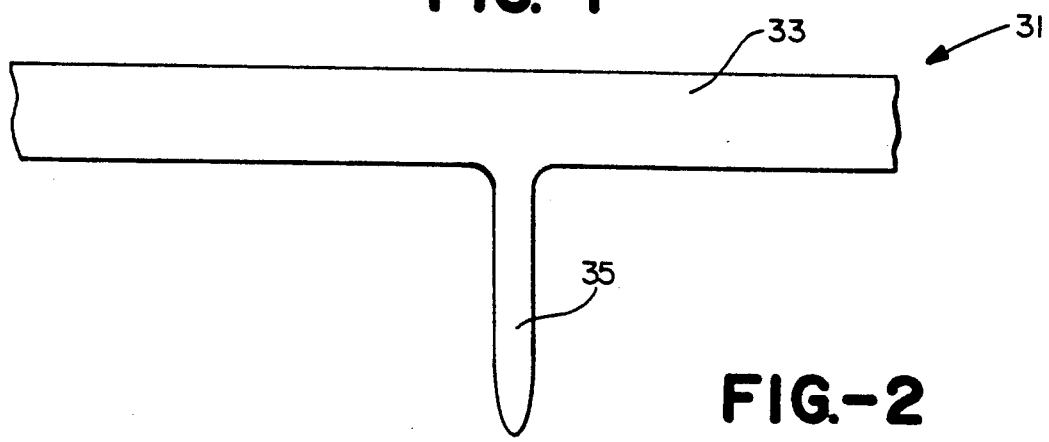
FIG. 2 is a side view of the cantilevered microtip that may be produced by the method illustrated in FIG. 1.

The material that forms the cantilever base 15 in FIG. 1 or 33 in FIG. 2 need not be a semiconductor of first conductivity type. It is sufficient if this material is merely resistant to etching by the electrolytic etchant that selectively etches away the second layer material of (net) second conductivity type. Thus, the cantilever base material could be insulator or dielectric material or any other non-semiconductor material that will not substantially impede the implantation of ions into the second layer.

If necessary, the resulting cantilevered microtip shown in FIG. 2 can be further shaped or sharpened through ion bombardment or reactive ion etching. One advantage of these microtips is that they have a high aspect ratio that is lithographically controllable. The resulting microtip 35 is integral with the cantilever base 39, and the cantilever base may be further provided with a more massive attachment block for purposes of control of the location and orientation of the microtip 35.

Figure 3:
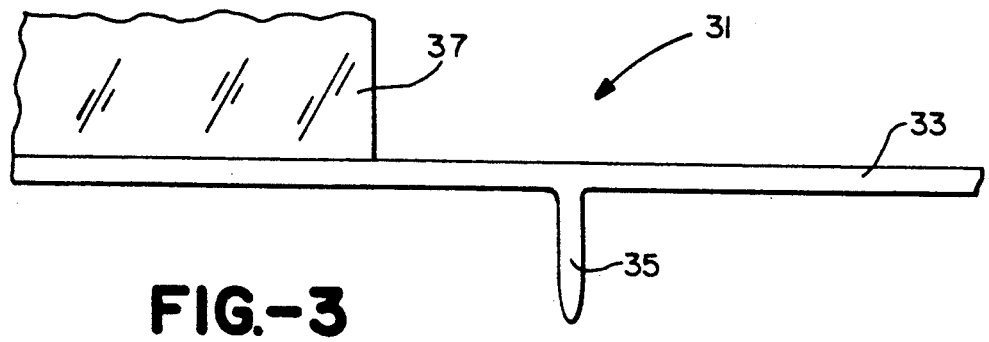
FIG. 3 is a side view showing the cantilevered microtip of FIG. 2 attached to a more massive material that may be moved in order to position the cantilevered microtip at a desired location and orientation.

One method of providing a more massive attachment block is illustrated in FIG. 3, where a cantilever base 33 is bonded through anodic bonding to a $SiO_2$-based material such as pyrex.

Figure 4:
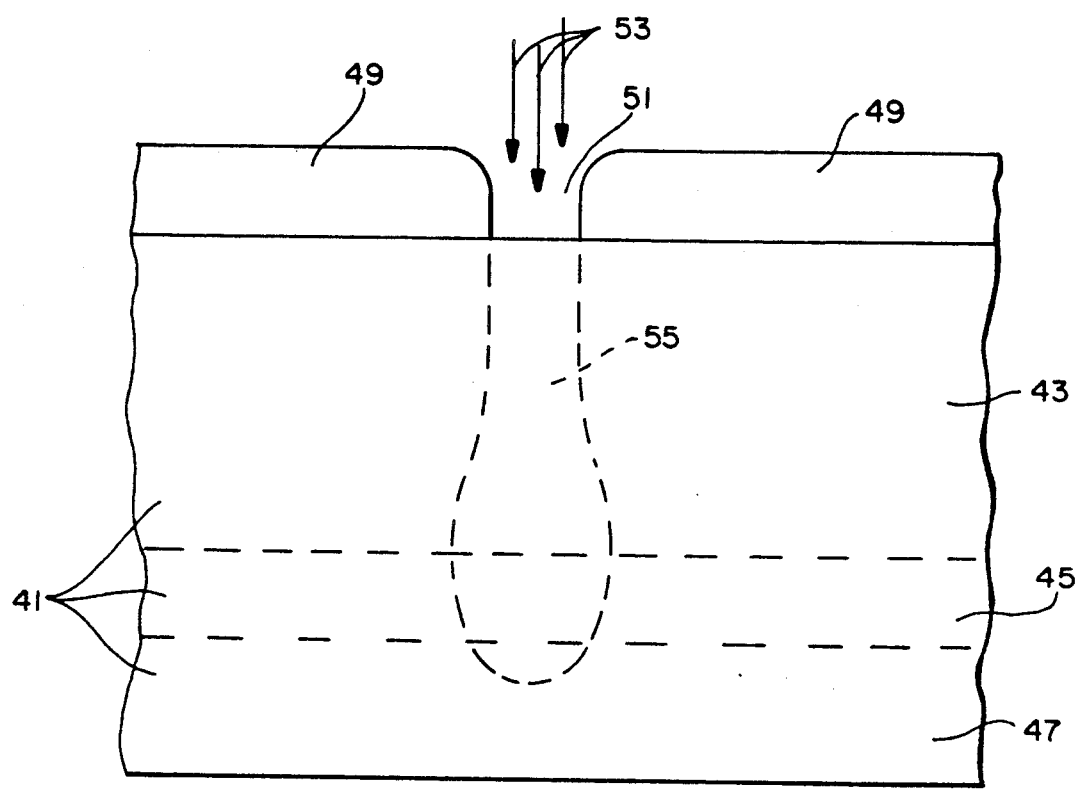
FIG. 4 is a sectional side view illustrating a second method of fabrication of the cantilevered microtip according to the invention.
Figure 5:
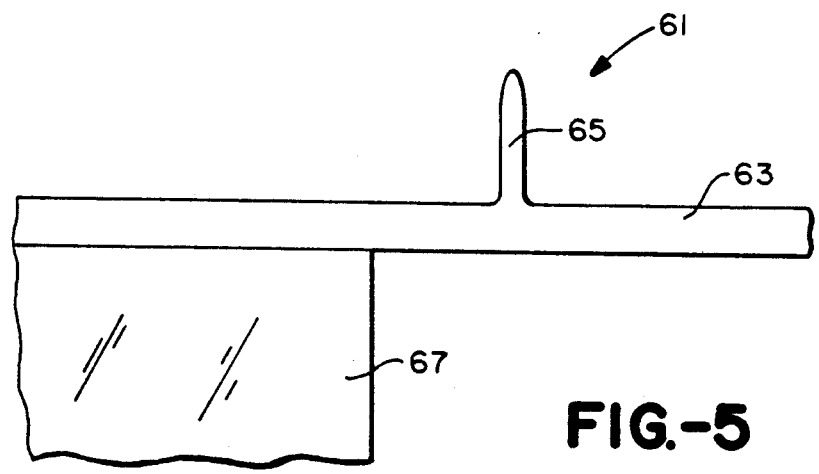
FIG. 5 is a sectional view showing the cantilevered microtip produced according to the method illustrated in FIG. 4.

The method illustrated in FIG. 1 produces microtips oriented downwardly and having a microtip that may have a greater transverse dimension near the bottom of the microtip than at the top of the microtip. In order to produce microtips oriented upwardly or with a transverse dimension that decreases approximately monotonically as one proceeds away from the cantilever base, the initial composite structure shown in FIG. 4 may be used. This structure consists of a sheet 41 of semiconductor material having a first layer 43 of second conductivity type, a second contiguous layer 45 of first conductivity type, and a third contiguous layer 47 of second conductivity type, where the layer 45 lies between the layers 43 and 47. A masking layer 49 is provided on an exposed surface of the layer 43 and has an aperture 51 therein that exposes a portion of the exposed surface of the layer 43. As before, a beam 53 of ions, drawn from an element of first conductivity type, is directed into and through the first layer 43 to form an ion profile 55 of first conductivity type as shown. The ion profile 55 should substantially overlap the thin second layer 45 of first conductivity type. As before, the remainder of the second conductivity type material present in the layers 43 and 47 is etched away by an electrolytic etchant, leaving a structure 61 shown in FIG. 5 that includes a cantilever base 63 and an upwardly projecting microtip 65 that is cantilevered from the base 63. Optionally, a more massive attachment block 67 may be provided for the cantilever base 63 in order to control the location and orientation of the microtip 65, as shown in FIG. 5. Again, shaping or sharpening of the end of the microtip may be done through ion bombardment or reactive ion etching. The semiconductor layer 45 in FIG. 4 may be replaced by a layer of material that resists etching by the electrolytic etchant, as discussed above.

Figure 6:
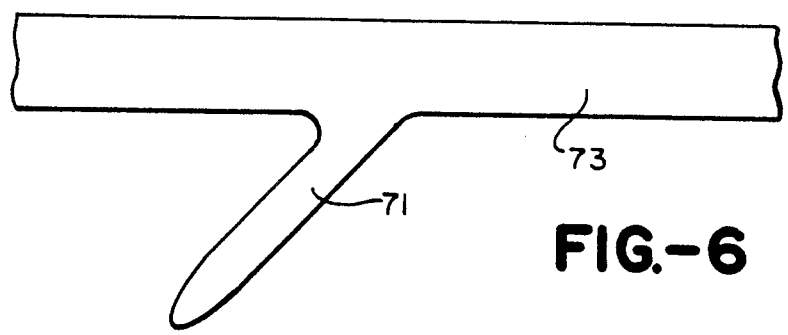
FIG. 6 is a sectional view showing the cantilevered microtip fabricated with a non-perpendicular orientation relative to the cantilever base according to the invention.

By selecting the crystalline orientation of the surface of the semiconductor material or the direction of the incident implantation ions, the cantilevered microtip 71 may be fabricated so that it is oriented at various angles relative to the cantilever base 73, itself, as shown in FIG. 6, if perpendicular orientation of the microtip relative to the cantilever base is not desired. The microtip and attached cantilever base will be electrically conductive because of the first conductivity type doping incorporated therein. This electrical conductivity may be further varied, to reduce it to approximately zero or to increase it to a desired number, by further diffusion of dopant of second conductivity type or first conductivity type, respectively, through the microtip and the cantilever base material. An electrically conductive microtip can be used for a microprobe using tunneling forces. Alternatively, the microtip and the cantilever base can be covered with an oxide, nitride or other insulating material as desired.

We claim:

1. A method of producing a cantilevered microtip, the method comprising the steps of:
   providing a two-layer structure of materials, having a first layer that is resistant to etching by a selected etchant, adjacent to a second layer of semiconductor material with doping of a first electrical conductivity type, where the first layer has an exposed surface and where the second layer of material is rapidly etched by the selected etchant;
   providing an ion implant mask adjacent to the exposed surface of the first layer, the mask having at least one aperture therein that exposes a small area of the adjacent exposed surface;
   implanting ions, formed from an element of a second electrical conductivity type, of predetermined kinetic energy into the two-layer structure through the mask in a predetermined direction so that the ions implanted form an ion profile with a controllable aspect ratio in the second layer;
   removing the mask material; and
   removing the portion of the second layer that is not implanted with ions by etching with the selected etchant, to expose the ion profile and the first layer as a single connected unit.

2. The method of claim 1, further comprising the step of orienting said second layer so that said predetermined direction of ion implantation approximately coincides with an ion channeling direction in said second layer.

3. The method of claim 2, further comprising the step of providing said ion channeling direction from the class consisting of the <110>, <111>, and <100> directions in said second layer of material.

4. The material of claim 1, further comprising the step of providing said ions for implantation from the class of p type elements consisting of beryllium, boron, magnesium, aluminum, gallium and indium.

5. The method of claim 1, further comprising the step of providing said ions for implantation from the class of n type elements consisting of nitrogen, oxygen, phosphorous, sulfur, arsenic, selenium, and antimony.

6. The method of claim 5, wherein said step of removing said portion of said second semiconductor layer that is not implanted with said ions comprises etching said portion with said selected etchant, which is chosen to be 8 $HNO_3$:1 $HF$:1 $HC_2H_3O_2$.

7. The method of claim 1, further comprising the step of subjecting said ion profile to ion bombardment.

8. The method of claim 1, further comprising the step of subjecting said ion profile to reactive ion etching.

9. A product produced by the method of claim 1.

10. The method of claim 1, further comprising the step of choosing the concentration of said doping of said second layer so that said ion profile has an aspect ratio of at least 5.

11. A method of producing a cantilevered microtip, the method comprising the steps of:
    providing a two-layer structure of semiconductor materials that has a first layer with doping of a first electrical conductivity type adjacent to a second layer with doping of a second electrical conductivity type, where the first layer has an exposed surface;
    providing an ion implant mask adjacent to the exposed surface of the first semiconductor layer, the mask having at least one small aperture therein that exposes a small area of the adjacent exposed surface;
    implanting ions, formed from an element of first electrical conductivity type, of predetermined kinetic energy into the semiconductor material through the mask in a predetermined direction so that the ions implanted form an ion profile with a controllable aspect ratio in the second semiconductor layer; and
    removing the mask material and the portion of the second semiconductor layer that is not implanted with ions, to expose the ion profile and the first semiconductor layer as a single connected unit.

12. The method of claim 11, further comprising the step of orienting said second semiconductor layer so that said predetermined direction of ion implantation approximately coincides with an ion channeling direction in said second semiconductor layer.

13. The method of claim 12, further comprising the step of providing said ion channeling direction from the class consisting of the <110>, <111>, and <100> directions in said second semiconductor material.

14. The material of claim 11, further comprising the step of providing said ions for implantation from the class of p type elements consisting of beryllium, boron, magnesium, aluminum, gallium and indium.

15. The method of claim 11, further comprising the step of choosing the concentration-of said doping of said second layer so that said ion profile has an aspect ratio of at least 5.

16. The method of claim 11, further comprising the step of providing said ions for implantation from the class of n type elements consisting of nitrogen, oxygen, phosphorous, sulfur, arsenic, selenium, and antimony.

17. The method of claim 11, further comprising the step of subjecting said ion profile to ion bombardment.

18. The method of claim 11, further comprising the step of subjecting said ion profile to reactive ion etching.

19. A product produced by the method of claim 11.

20. A method of producing a cantilevered microtip with a high aspect ratio, the method comprising the steps of:
    providing a three-layer structure of materials having a first layer of semiconductor material with doping of a first electrical conductivity type, a second layer of semiconductor material with doping of first electrical conductivity type, with a third layer that is resistant to etching by a selected etchant, the third layer being positioned between the first and second layers, where the first layer has an exposed surface and lies between this exposed surface and the third layer and where the first and second layers of material are rapidly etched by the selected etchant;
    providing an ion implant mask adjacent to the exposed surface of the first layer, the mask having at least one aperture therein that exposes a small area of the adjacent exposed surface;
    implanting ions, formed from an element of second electrical conductivity type of predetermined kinetic energy into the first and third layers through the aperture in the mask in a predetermined direction so that the ions implanted form an ion profile with a controllable aspect ratio in the first layer; and
    removing the mask material; and
    removing the second layer and the portion of the first layer that is not implanted with ions by etching with the selected etchant, to expose the ion profile and the third layer as a single connected unit.

21. The method of claim 20, further comprising the step of orienting said first layer so that said predetermined direction of ion implantation approximately coincides with an ion channeling direction in said first layer.

22. The method of claim 21, further comprising the step of providing said ion channeling direction from the class consisting of the <110>, <111>, and <100> directions in said first layer.

23. The method of claim 20, further comprising the step of providing said ions for implantation from the class of p type elements consisting of beryllium, boron, magnesium, aluminum, gallium and indium.

24. The method of claim 20, further comprising the step of providing said ions for implantation from the class of n type elements consisting of nitrogen, oxygen, phosphorous, sulfur, arsenic, selenium and antimony.

25. The method of claim 24, wherein said step of removing said portion of said first layer that is not implanted with said ions comprises etching said portion with said selected etchant, which is chosen as 8 $HNO_3$:1 HF: 1 $HC_2H_3O_2$.

26. The method of claim 20, further comprising the step of subjecting said ion profile to ion bombardment.

27. The method of claim 20, further comprising the step of subjecting said ion profile to reactive ion etching.

28. A product produced by the method of claim 21.

29. The method of claim 20, further comprising the step of choosing the concentration of said doping of said first layer so that said ion profile has an aspect ratio of at least 5.

30. A method of producing a cantilevered microtip with a high aspect ratio, the method comprising the steps of:
providing a three-layer structure of semiconductor materials that has a first layer with doping of a first electrical conductivity type, a second layer with doping of first electrical conductivity type, with a third layer with doping of a second electrical conductivity type being positioned between the first and second semiconductor layers, where the first layer has an exposed surface and lies between this exposed surface and the third semiconductor layer;
providing an ion implant mask adjacent to the exposed surface of the first semiconductor layer, the mask having at least one aperture therein that exposes a small area of the adjacent exposed surface;
implanting ions, formed from an element of second electrical conductivity type of predetermined kinetic energy into the first and third semiconductor layers through the aperture in the mask in a predetermined direction so that the ions implanted form an ion profile with a controllable aspect ratio in the first semiconductor layer; and
removing the mask material, the second semiconductor layer and the portion of the first semiconductor layer that is not implanted with ions, to expose the ion profile and the third semiconductor layer as a single connected unit.

31. The method of claim 30, further comprising the step of orienting said first semiconductor layer so that said predetermined direction of ion implantation approximately coincides with an ion channeling direction in said first semiconductor layer.

32. The method of claim 31, further comprising the step of providing said ion channeling direction from the class consisting of the <110>, <111>, and <100> directions in said first semiconductor layer.

33. The method of claim 30, further comprising the step of providing said ions for implantation from the class of p type elements consisting of beryllium, boron, magnesium, aluminum, gallium and indium.

34. The method of claim 30, further comprising the step of providing said ions for implantation from the class of n type elements consisting of nitrogen, oxygen, phosphorous, sulfur, arsenic, selenium and antimony.

35. The method of claim 34, wherein said step of removing said portion of said first semiconductor layer that is not implanted with said ions comprises etching said portion with an electrolytic etchant, which is chosen as 8 $HNO_3$:1 HF:1 $HC_2H_3O_2$.

36. The method of claim 30, further comprising the step of subjecting said ion profile to ion bombardment.

37. The method of claim 30, further comprising the step of subjecting said ion profile to reactive ion etching.

38. The product produced by the method of claim 31.

39. The method of claim 30, further comprising the step of choosing the concentration of said doping of said first layer so that said ion profile has an aspect ratio of at least 5.

* * * * *